(12) United States Patent
Kim et al.

(10) Patent No.: US 7,551,514 B2
(45) Date of Patent: Jun. 23, 2009

(54) SEMICONDUCTOR MEMORY UTILIZING A METHOD OF CODING DATA

(75) Inventors: Sang-yun Kim, Yongin-si (KR);
Jung-bae Lee, Yongin-si (KR);
Young-don Choi, Anseong-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 132 days.

(21) Appl. No.: 11/836,283

(22) Filed: Aug. 9, 2007

(65) Prior Publication Data
US 2008/0151651 A1 Jun. 26, 2008

(30) Foreign Application Priority Data
Dec. 21, 2006 (KR) .................... 10-2006-0132026

(51) Int. Cl.
*G11C 8/00* (2006.01)
(52) U.S. Cl. .................. 365/236; 365/189.07; 365/239
(58) Field of Classification Search .................. 365/236, 365/239, 189.17
See application file for complete search history.

(56) References Cited

FOREIGN PATENT DOCUMENTS

| | | |
|---|---|---|
| JP | 2003141877 | 5/2003 |
| KR | 1020020058423 A | 7/2002 |
| KR | 1020030091233 A | 12/2003 |

*Primary Examiner*—Son Dinh
*Assistant Examiner*—R Lance Reidlinger
(74) *Attorney, Agent, or Firm*—Volentine & Whitt, PLLC

(57) ABSTRACT

A semiconductor memory device utilizing a data coding method in an initial operation. The device includes a plurality of counters that count the number of data bits and flag information data bits. A data coding unit selectively applies a first and second operation mode. The first operation mode codes the data of the first through nth data groups such that the counted number of data bits in a first logic state is minimized. The second operation mode codes the data of the first through nth data groups such that the difference between the number of data bits and flag information bits in the first and second logic state are minimized. This prevents the initial logic state of data from being changed due to a voltage drop in the initial operation of the device.

31 Claims, 10 Drawing Sheets

THE NUMBER OF DATA BITS AT LOGIC HIGH LEVEL = 6 → 7 → 10

THE NUMBER OF DATA BITS AT LOGIC HIGH LEVEL= 5→6→7→10

US 7,551,514 B2

SEMICONDUCTOR MEMORY UTILIZING A METHOD OF CODING DATA

CROSS-REFERENCE TO RELATED APPLICATION

This U.S. non-provisional application claims priority under 35 U.S.C § 119 of Korean Patent Application No. 10-2006-0132026 filed on Dec. 21, 2006, the entire contents of which are hereby incorporated by reference.

BACKGROUND OF THE INVENTION

1. Field of the Invention

Embodiments of the invention relate to a semiconductor memory device data coding method. More particularly, embodiments of the invention relate to a data coding method in an initial operation of a semiconductor memory device.

2. Discussion of Related Art

FIG. 1 is a circuit diagram of a conventional semiconductor memory device 100 to illustrate the transmission and reception of data. FIG. 2 is a graph illustrating an initial operation of the semiconductor memory device 100. Data output through data input/output pads DQ_0 through DQ_n-1 of semiconductor memory device 100 is transmitted to receiving stage RX via transmission stage TX. Transmission stage TX requires a driving current in order to transmit the data to receiving stage RX. When semiconductor memory device 100 outputs ten data bits in a first logic state corresponding to a logic high in an initial operation as illustrated in FIG. 2, the inductance of an inductor connected between a source of power supply voltage VDD and a source of ground voltage VSS is 1 nH. The driving current of transmission stage TX outputting the data bits is 20 mA. The time required to change the logic state of the output data bits to the first logic state is 0.5 ns. The voltage applied to the inductor is represented as:

$$V = n*L(di/dt) = 10*1\text{nH}*(20\text{ mA}/0.5\text{ ns}) = 0.4V \quad (1)$$

where n is the number of data bits in the first logic state. That is, the voltage applied to the inductor is 0.4V when ten data bits in the first logic state are output. Accordingly, the voltage drop due to the inductor becomes problematic when the power supply voltage VDD is low while the voltage drop due to the inductor when the power supply voltage VDD is high can be ignored. When the voltage drop due to the inductor is large, data bits that must be output in the first logic state may be output in a second logic state. The second logic state corresponds to a logic low. For example, when the power supply voltage VDD is 1.3V and 1V is required for the output of data bits having the first logic state, the voltage drop caused by the inductor, 0.4V, decreases the power supply voltage VDD to 0.9V. Thus, the data bits outputted cannot be in the first logic state. Accordingly, the logic state of initial data is varied due to the voltage drop caused by the inductor in the initial operation of conventional memory device 100.

SUMMARY OF THE INVENTION

Exemplary embodiments of the present invention are directed to a semiconductor memory device that maintains the logic state of initial data in an initial operation. In an exemplary embodiment, the semiconductor memory device includes a plurality of counters configured to count the number of data bits and flag information data bits having a first logic state in a first data group including at least one data bit and second through nth data groups each including at least one data bit and a flag information data bit. A data coding unit communicates with the plurality of counters and selectively applies a first operation mode and a second operation mode to each of the first through nth data groups. The data coding unit codes data of each of the first through nth data groups wherein the first operation mode codes the data of each of the first through nth data groups to minimize the number of data bits in the first logic state in each of the first through nth data groups. The data coding unit also performs the second operation mode to code the data of each of the first through nth data groups in order to minimize the difference between the number of data bits and flag information data bits in the first logic stage and the number of data bits and flag information data bits in a second logic state associated with the first through nth data groups.

DESCRIPTION OF EMBODIMENTS

Figure 1:
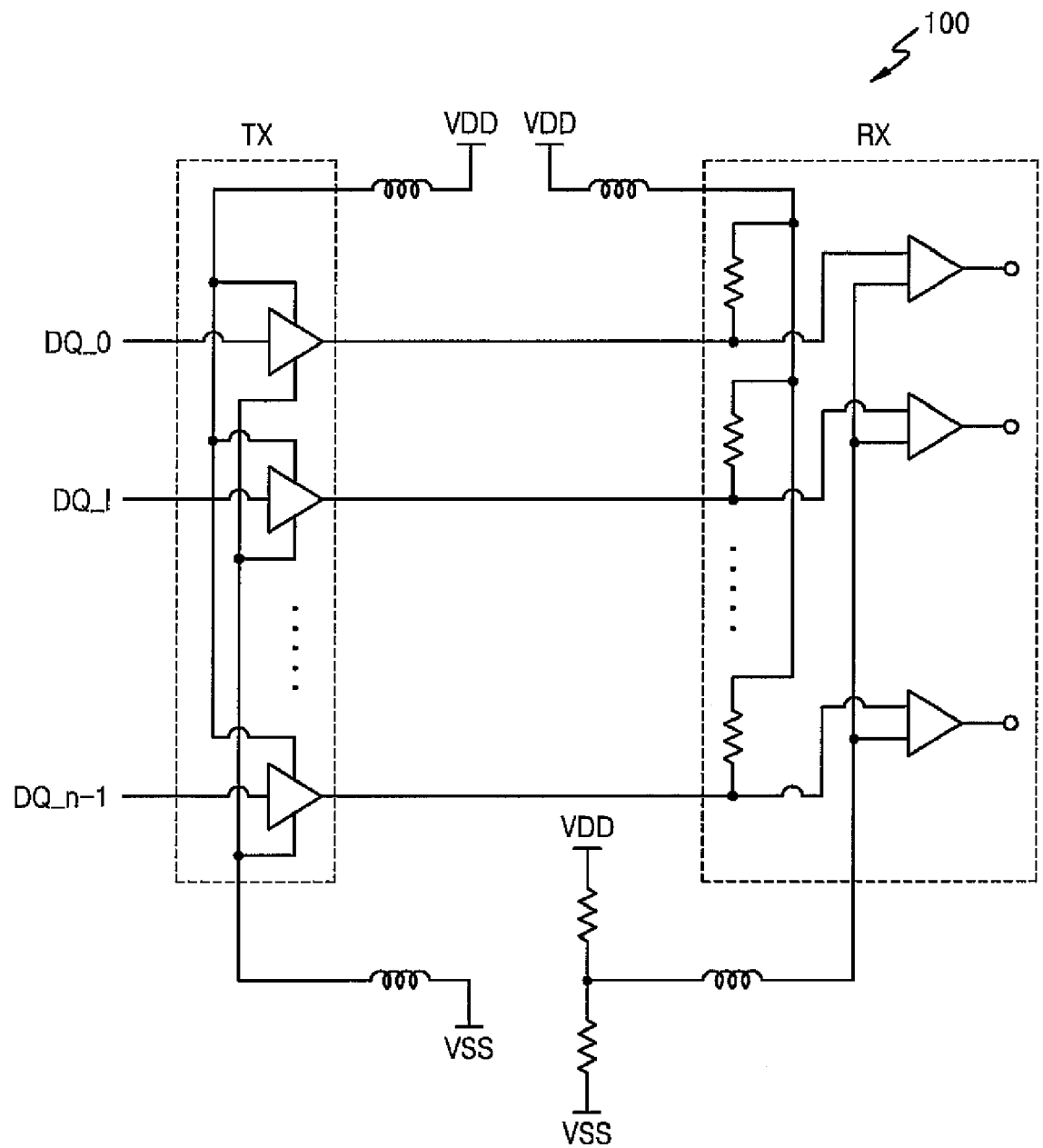
FIG. 1 is a circuit diagram of a conventional semiconductor memory device.
Figure 2:
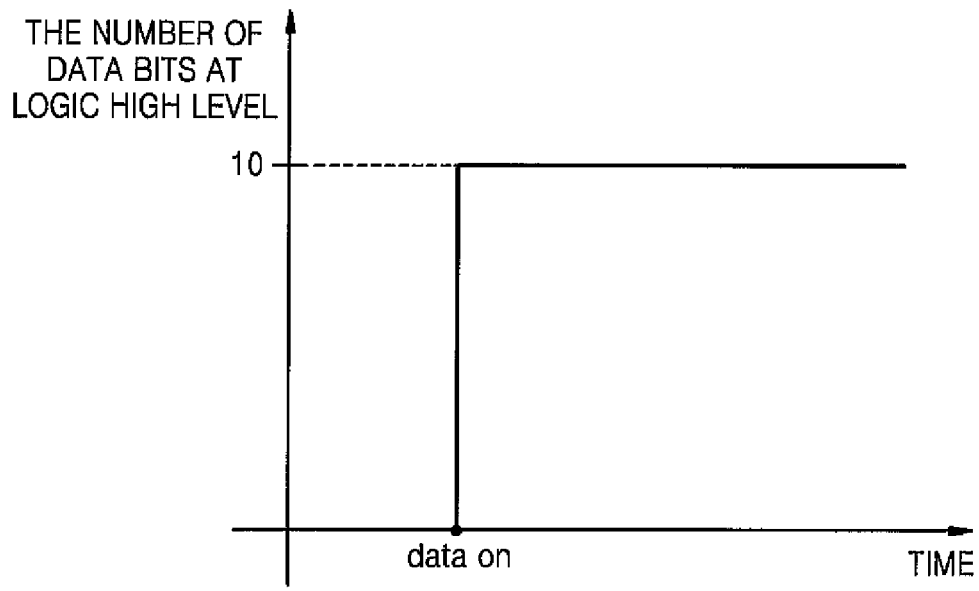
FIG. 2 is a graph illustrating an initial operation of the semiconductor memory device illustrated in FIG. 1.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 3:
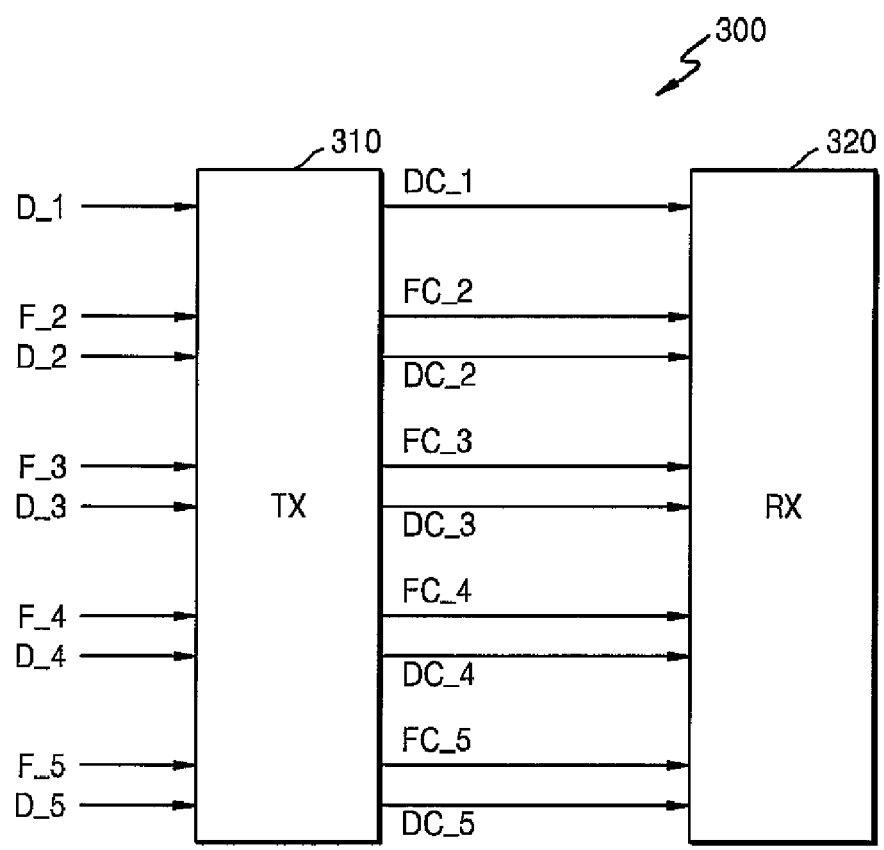
FIG. 3 is a block diagram of a semiconductor memory device according to an embodiment of the present invention.

FIG. 3 is a block diagram of a semiconductor memory device 300 that includes a transmission stage TX and a receiving stage RX. First through fifth data groups D_1 through D_5 and flag information F_2, F_3, F_4 and F_5 associated with second, third, fourth, and fifth data groups D_2, D_3, D_4 and D_5 are input to transmission stage 310. Transmission stage 310 codes data bits and flag information of the first through fifth data groups D_1 through D_5. Transmission stage 310 outputs the coded data groups DC_1 through DC_5 and coded flag information FC_2, FC_3, FC_4 and FC_5 to receiving stage 320.

Figure 4:
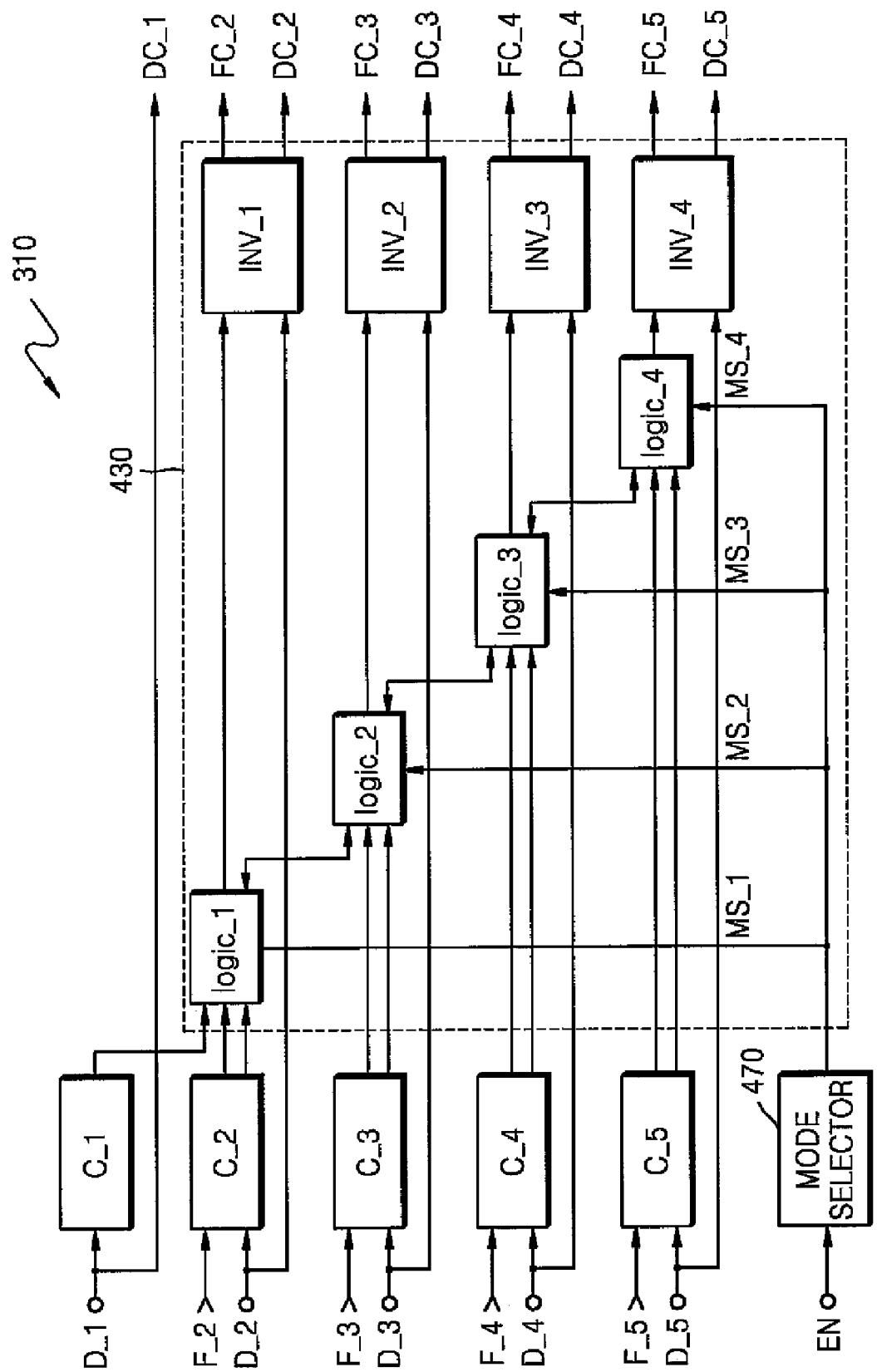
FIG. 4 is a block diagram of a transmission stage illustrated in FIG. 3.

FIG. 4 is a block diagram of the transmission stage 310 shown in FIG. 3A to illustrate a method of coding the first through fifth data groups D_1 through D_5 and the flag information F_2, F_3, F_4 and F_5. The first through fifth data groups D_1 through D_5 and the flag information F_2, F_3, F_4 and F_5 illustrated in FIG. 3 are referred to as first through fifth groups hereinafter. In particular, the first group includes only first data group D_1 because it has no flag information. The second group includes second data group D_2 and flag information F_2. The third group includes third data group D_3 and flag information F_3. The fourth group includes fourth data group D_4 and flag information F_4. The fifth group includes fifth data group D_5 and flag information F_5.

FIG. 4 illustrates transmission stage 310 having a plurality of counters C_1, C_2, C_3, C_4 and C_5, data coding unit 430 and mode selector 470. The plurality of counters C_1 through C_5 receive the first through fifth data groups respectively and each count the number of data bits and flag information data bits in a first logic state. The first logic state may be, for example, a logic high state. Data coding unit 430 selectively applies a first mode and a second mode to the first through fifth groups to code data of the first through fifth groups. Mode selector 470 outputs mode selecting signals MS_1, MS_2, MS_3 and MS_4 to data coding unit 430 in response to an enable signal EN such that the data coding unit 430 applies one of the first mode and the second mode to the first through fifth data groups. The data bits of each of the first through fifth groups are coded such that the counted number of data bits having the first logic state in the first through fifth data groups is minimized in the first mode. The data bits of each of the first through fifth data groups are coded where a difference between the number of data bits and flag information data bits in the first logic state and the number of data bits and flag information data bits in the second logic state in the first through fifth groups is minimized in the second mode. The second logic state may be, for example, a logic low state.

Data coding unit 430 includes at least one flag setting portion defined by logic_1, logic_2, logic_3 and logic_4 and at least one data converter defined by INV_1, INV_2, INV3 and INV4. The at least one flag setting portion changes the flag information when the number of data bits having the first logic state is greater than the number of data bits in the second logic state in each of the second, third, fourth and fifth data groups to which the first mode is applied. In addition, the at least one flag setting portion changes the flag information such that the difference between the number of data bits and flag information data bits in the first logic state and the number of data bits and flag information data bits in the second logic state in each of the second, third, fourth and fifth groups to which the second mode is applied. When the flag information is changed, the data converter INV_1, INV_2, INV_3 and INV_4 inverts the data bits of the group including the changed flag information in the first mode or the second mode.

Figure 5:
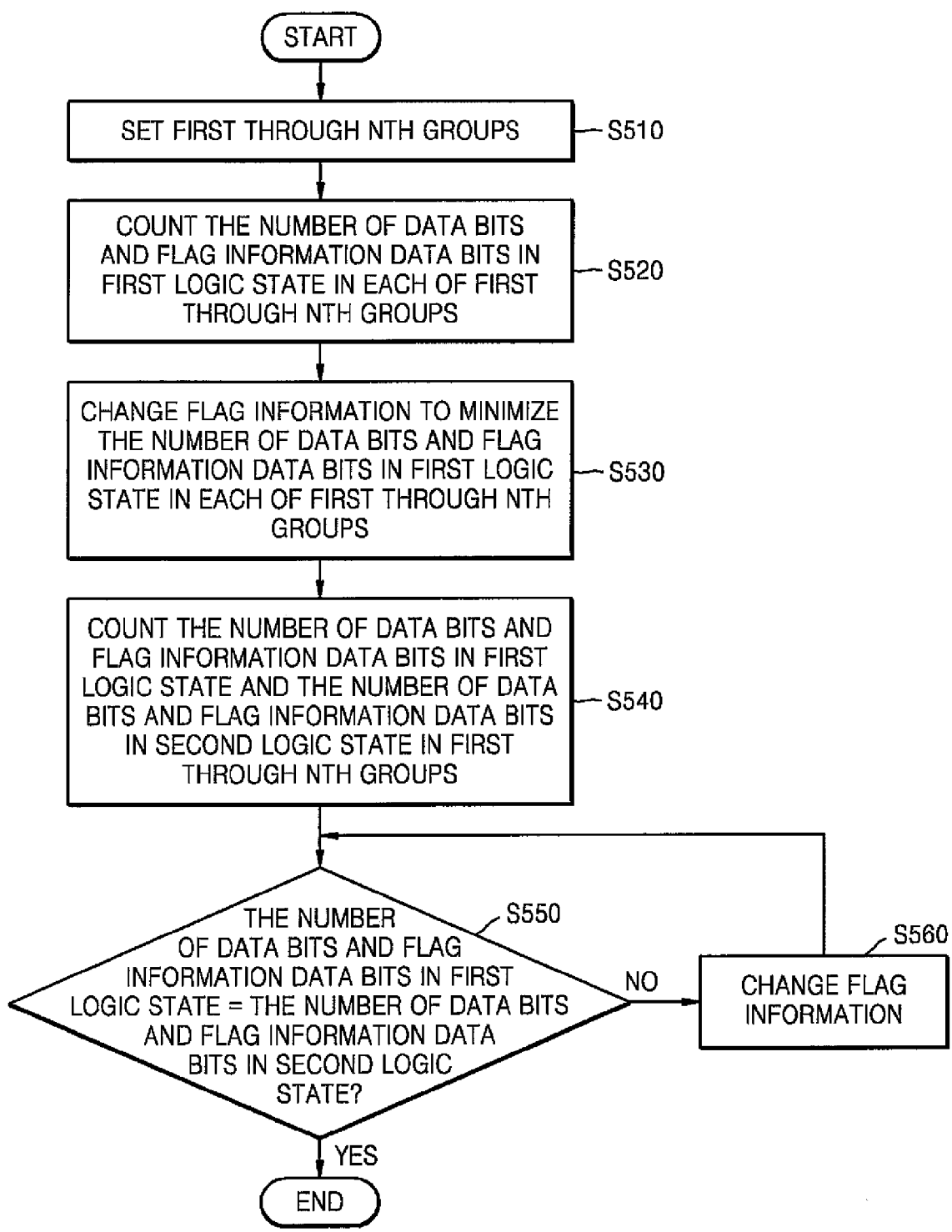
FIG. 5 is a flow chart of a method of coding data in the transmission stage illustrated in FIG. 3.

FIG. 5 is a flow chart of a data coding method in an initial operation of the semiconductor memory device 300 shown in FIG. 3. The data bits and flag information of the first through fifth data groups are set to the first through fifth groups, as illustrated in FIG. 4, in step S510. In step S520, counters C_1 through C_5 count the numbers of data bits and flag information data bits in the first logic state in each of the first through fifth groups respectively. Specifically, counter C_1 counts the number of data bits in the first logic state in the first group, and counter C_2 counts the number of data bits and flag information data bits having the first logic state in the second group. Counter C_3 counts the number of data bits and flag information data bits having the first logic state in the third group. Counter C_4 counts the number of data bits and flag information data bits having the first logic state in the fourth group. Counter C_5 counts the number of data bits and flag information data bits having the first logic state in the fifth group. When the number of data bits having the first logic state in each of the first through fifth groups is counted, the flag information is changed. Accordingly, the number of data bits and flag information data bits having the first logic state in each of the first through fifth groups is minimized in step S530.

The number of data bits and flag information data bits having the first logic state and the number of data bits and flag information data bits having the second logic state in the first through fifth groups are counted in step S540. Step S540 is easily executed by using the result of step S530. In step S550, the counted number of data bits and flag information data bits having the first logic state are compared to the counted number of data bits and flag information data bits in the second logic state. When they are different, the flag information of a corresponding group of the first through fifth data groups is changed in step S560. It is preferable that step S560 is performed for the second, third, fourth and fifth data groups sequentially from the group having the smallest number of data bits. Otherwise, step S560 is sequentially carried out for the fifth through second data groups. The number of data bits and flag information data bits having the first logic state and the number of data bits and flag information data bits having the second logic state, which have been varied due to the change of the flag information, are compared to each other. When the number of data bits and flag information data bits in the first logic state is equal to the number of data bits and flag information data bits in the second logic state or the difference between the number of data bits and flag information data bits in the first logic state and the number of data bits and flag information data bits in the second logic state is unchanged as determined at step S550, the data coding operation is finished. When the first through fifth data groups are set, it is preferable that the number of data bits of the first group that does not include flag information is smaller than the number of data bits of the second, third, fourth and fifth groups. When the data bits of the first through fifth groups are coded, the number of data bits in the first logic state is sequentially increased. In this manner, the number of data bits in the first logic state can be minimized by minimizing the number of data bits of the first group.

Figure 6:
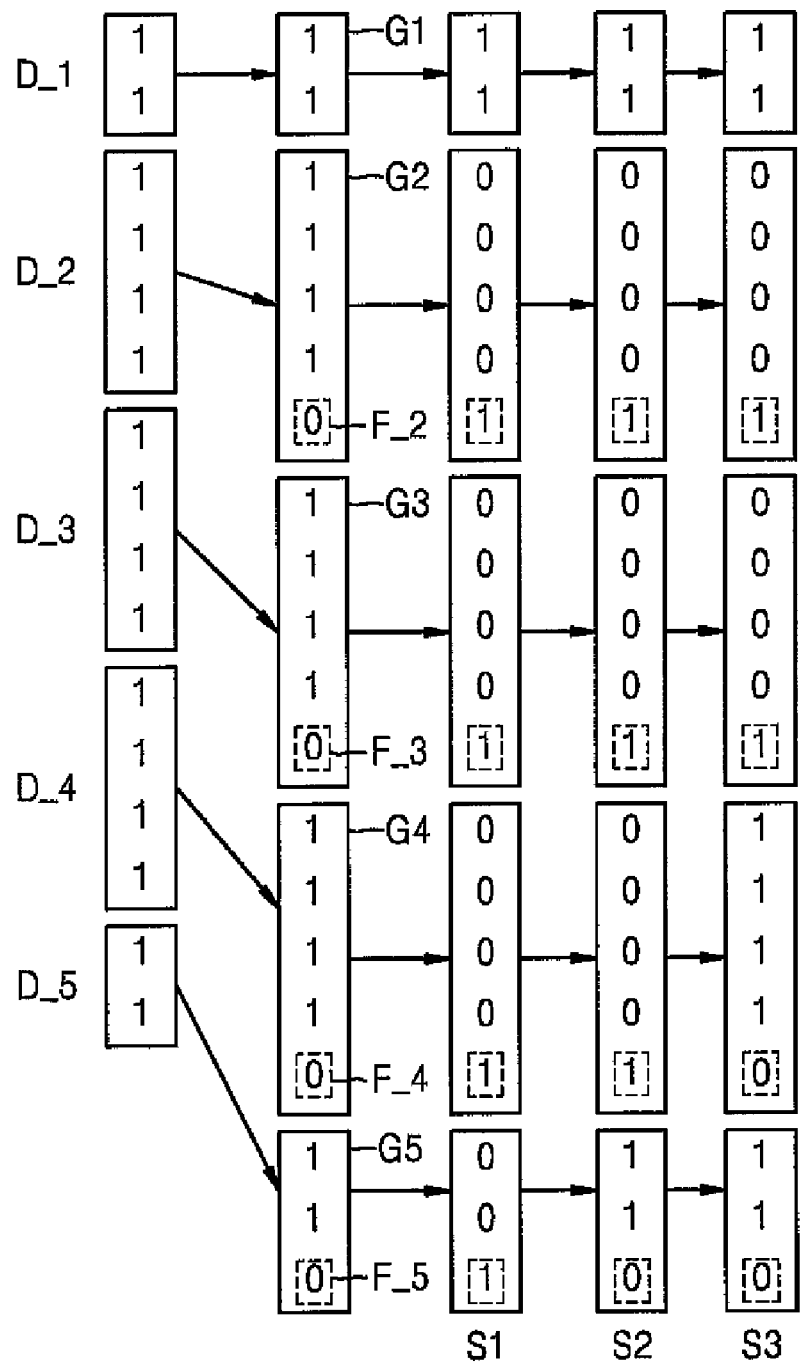
FIG. 6 illustrates a process of coding data in the transmission stage illustrated in FIG. 3.

FIG. 6 illustrates a process of coding data wherein 16-bit data, grouped into first through fifth data groups D_1 through D5, initially has a first logic state and the 16-bit data and 4-bit flag information F_2, F_3, F_4 and F_5 are grouped into first through fifth groups G1 through G5. In particular, first group G1 corresponds to first data group D_1, and second group G2 includes second data group D_2 and flag information F_2. Third group G3 includes third data group D_3 and flag information F_3. Fourth group G4 includes fourth data group D_4 and flag information F_4. Fifth group G5 includes fifth data group D_5 and flag information F_5.

Second group G2 includes four data bits having the first logic state and one flag information data bit in the second logic state. Accordingly, flag information F_2 is changed such that the number of data bits in the first logic state is minimized. That is, the second logic state of flag information F_2 is changed to the first logic state to invert the data bits of second data group D_2. As a result, second group G2 has one bit in the first logic state and four bits in the second logic state. Thus, the number of bits in the first logic state is minimized. The same operation is performed for the third G3, fourth G4 and fifth G5 groups to minimize the number of data bits in the first logic state in the third G3, fourth G4 and fifth G5 groups in step S1.

The first G1 through fifth G5 groups include six bits having the first logic state and fourteen bits in the second logic state when step S1 is finished. The first logic state of flag information F_5 of fifth group G5 is changed to the second logic state. This is done to minimize the difference between the number of data bits and information data bit in the first logic state and the number of data bits and information data bit in the second logic state. The fifth group G5 is coded such that the difference between the number of data bits and information data bit in the first logic state and the number of data bits and information data bit in the second logic state is minimized in the first G1 through fifth G5 groups. In addition, each of the second G2, third G3 and fourth G4 groups, are coded so that the number of data bits in the first logic state is minimized in step S2. Consequently, the first G1 through fifth G5 groups have seven bits in the first logic state and thirteen bits in the second logic state. Then, the first logic state of flag information F_4 of fourth group G4 is changed to the second logic state in order to minimize the difference between the number of data bits and flag information data bit in the first and second logic states. In step S3, each of the fourth G4 and fifth G5 groups are coded so that the difference between the number of data bits and flag information data bit in the first logic state and the number of data bits and flag information data bit in the second logic state in the first G1 through fifth G5 groups is minimized. Each of the second G2 and third G3 groups are coded so that the number of data bits in the first logic state is minimized. The first G1 through fifth G5 groups have ten bits in the first logic state and ten bits in the second logic state. The data coding operation is finished because the number of bits in the first logic state becomes equal to the number of bits in the second logic state. It is preferable that operation S2 is sequentially executed for the second G2, third G3, fourth G4 and fifth G5 groups and from the group having the smallest number of data bits. Step S2 is initially performed for the fifth group G5 because the second G2, third G3, and fourth G4 groups each have four data bits and the fifth group G5 has two data bits.

Figure 7:
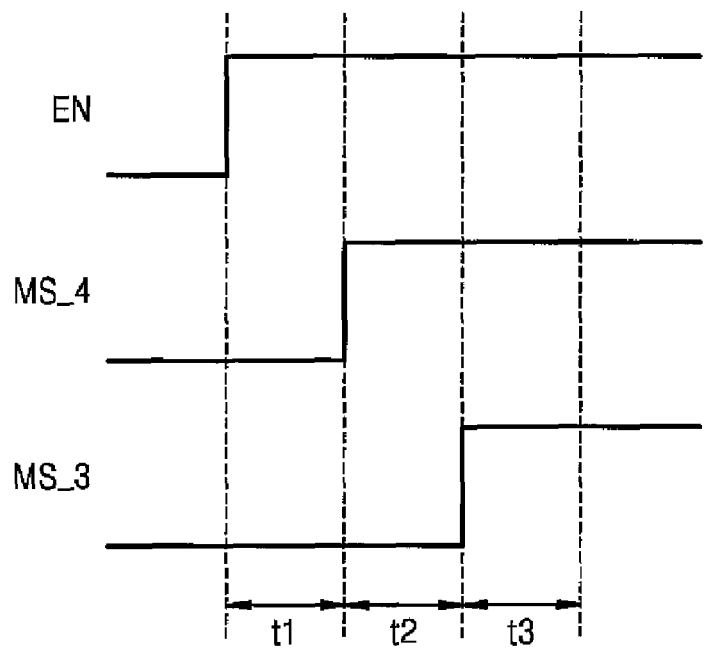
FIG. 7 is a waveform diagram of an input signal and output signals of a mode selector illustrated in FIG. 4.

FIG. 7 is a waveform diagram of input and output signals of mode selector 470 illustrated in FIG. 4. Referring to FIGS. 4, 6 and 7, when enable signal EN is input to mode selector 470, the mode selector 470 outputs mode selecting signals MS_1, MS_2, MS_3 and MS_4 to data coding unit 430. The flag setting parts logic_1, logic_2, logic_3 and logic_4 of data coding unit 430 perform the first mode when the mode selecting signals MS_1, MS_2, MS_3 and MS_4 are in the second logic state and executes the second mode when the mode selecting signals MS_1, MS_2, MS_3 and MS_4 are in the first logic state. Mode selector 470 respectively outputs the mode selecting signals MS_1, MS_2, MS_3 and MS_4 in the second logic state to flag setting parts logic_1, logic_2, logic_3 and logic_4 for a time t1 in response to enable signal EN. Accordingly, the flag setting parts logic_1, logic_2, logic_3 and logic_4 perform the first mode for the time t1 in step S1 illustrated in FIG. 6.

Mode selector 470 outputs mode selecting signal MS_4 in the first logic state to the flag setting part logic_4 and outputs the mode selecting signals MS_1, MS_2 and MS_3 in the second logic state to flag setting parts logic_1, logic_2 and logic_3 for a time t2. Accordingly, flag setting part logic_4 carries out the second mode and the flag setting parts logic_1, logic_2 and logic_3 execute the first mode for time t2 in step S2 shown in FIG. 6. Mode selector 470 outputs the mode selecting signals MS_3 and MS_4 in the first logic state to the flag setting parts logic_3 and logic_4 and outputs mode selecting signals MS_1 and MS_2 in the second logic state to flag setting parts logic_1 and logic_2 for a time t3. Accordingly, flag setting parts logic_3 and logic_4 carry out the second mode and the flag setting parts logic_1 and logic_2 execute the first mode for time t3 in step S3 also shown in FIG. 6. While the data coding process is finished when the mode selector 470 outputs mode selecting signals MS_3 and MS_4 to flag setting parts logic_3 and logic_4 in the case illustrated in FIG. 6, mode selector 470 may output the mode selecting signals MS_1, MS_2, MS_3 and MS4 to the flag setting parts logic_1, logic_2, logic_3 and logic_4 respectively to perform the data coding operation.

Figure 8:
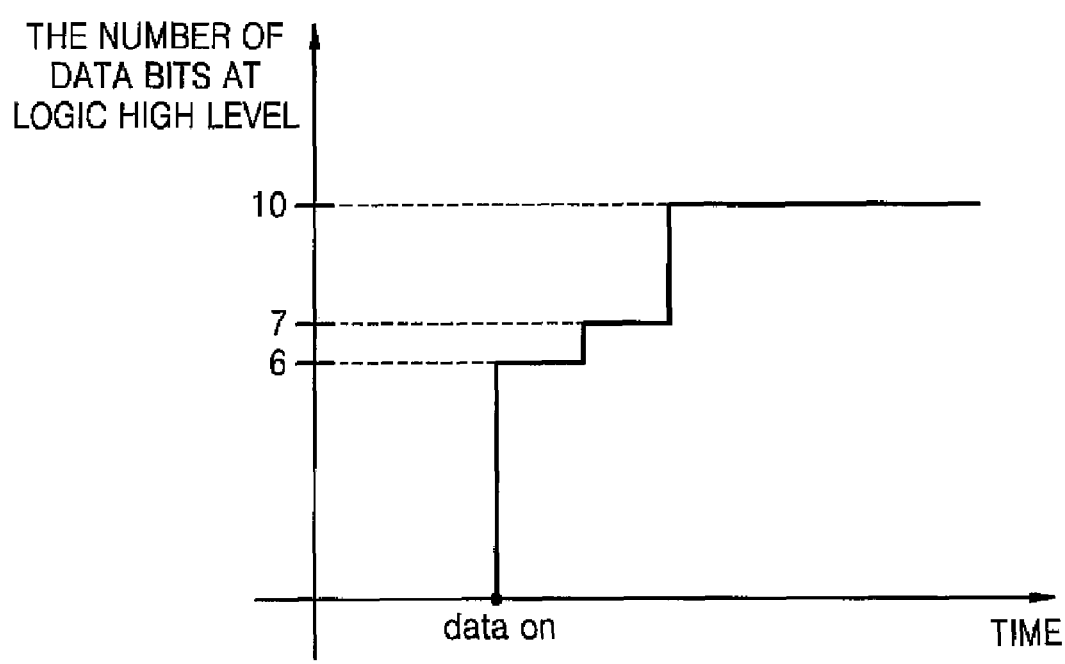
FIG. 8 is a graph illustrating an initial operation of the semiconductor memory device illustrated in FIG. 3 when the data coding method illustrated in FIG. 6 is performed.

FIG. 8 is a graph illustrating an initial operation of the semiconductor memory device 300 shown in FIG. 3 when the data coding process illustrated in FIG. 6 is performed. Referring to FIGS. 6 and 8, six bits in the first logic state are obtained when step S1 is executed and provided as an intial output. Then, seven bits in the first logic state are output through step S2 and ten bits in the first logic state are output via step S3. In this manner, the number of bits in the first logic state is gradually increased. This solves the aforementioned problem with conventional semiconductor memory devices where the logic state of data bits is changed due to a voltage drop in the initial operation.

A voltage drop caused by an inductor in the semiconductor memory device under the same condition as illustrated in FIG. 1 will now be described with reference to FIGS. 1 and 8. When the inductance of the inductor connected between power supply voltage VDD and ground voltage VSS is 1 nH, the driving current of transmission stage TX outputting data is 20 mA, and 0.5 ns is taken to change the logic state of the output data to the first logic state, the voltage applied to the inductor is represented as:

$$V = n*L(di/dt) = 6*1\text{nH}*(20\text{mA}/0.5\text{ns}) = 0.24V \qquad (2)$$

That is, the voltage applied to the inductor is 0.24V in the initial operation of the semiconductor memory device because six bits in the first logic state (n is the number of data bits in the first logic state) are output in the initial operation of the device. Accordingly, the problem associated with a conventional semiconductor memory device where the initial logic state of data bits is changed due to the voltage drop caused by the inductor in the initial operation is solved.

Figure 9:
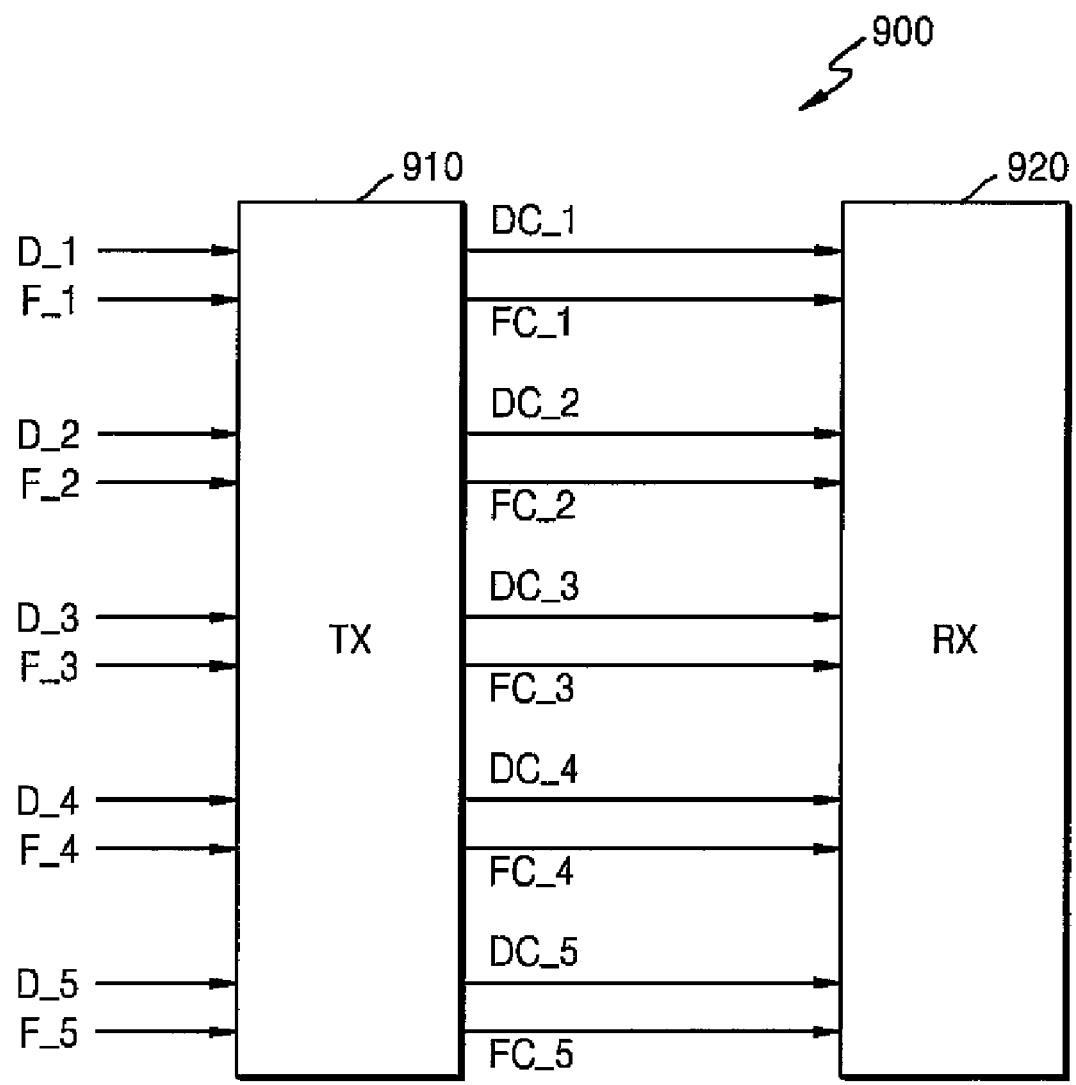
FIG. 9 is a block diagram of a semiconductor memory device according to another embodiment of the present invention.

FIG. 9 is a block diagram of a semiconductor memory device 900 having transmission stage TX 910 and receiving stage RX 920. Semiconductor memory device 900 is distinguished from the semiconductor memory device 300 illustrated in FIG. 3 in that flag information F_1 is input to transmission stage 910. Flag information data bits F_1 through F_5 corresponding to the data groups D_1 through D_5 respectively are input to semiconductor memory device 900. The transmission stage TX 910 codes the data groups D_1 through D_5 and flag information F_1 through F_5, outputs the coded data groups DC_1 through DC_5 and coded flag information FC_1 through FC_5.

Figure 10:
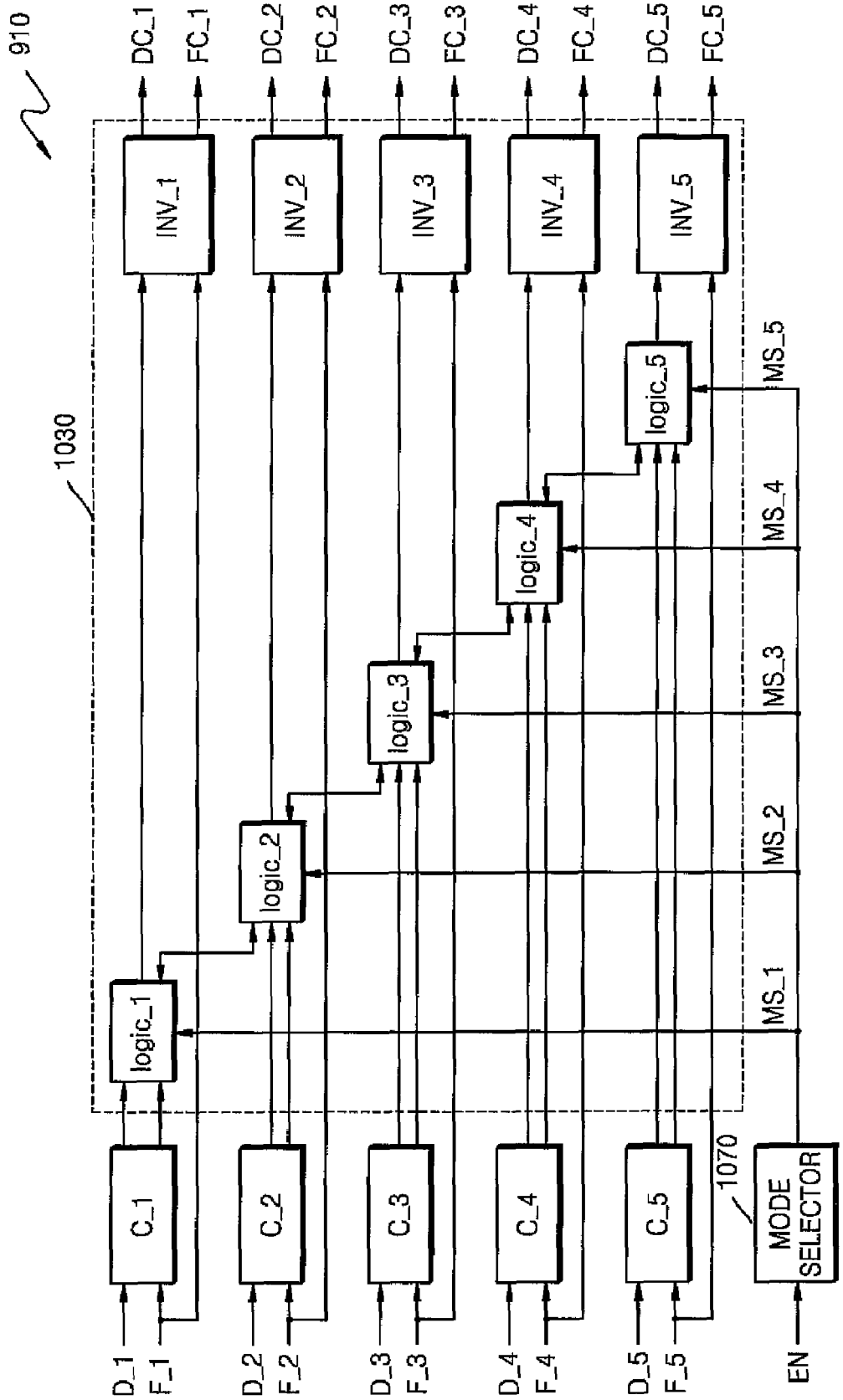
FIG. 10 is a block diagram of a transmission stage illustrated in FIG. 9.

FIG. 10 is a more detailed diagram of transmission stage TX 910 illustrated in FIG. 9 which includes a plurality of counters C_1, C_2, C_3, C_4 and C_5, data coding unit 1030 and mode selector 1070. The plurality of counters C_1 through C_5, data coding unit 1030 and mode selector 1070 each perform the same functions as those of the transmission stage 310 illustrated in FIG. 4. Counter C_1 receives flag information F_1 in addition to first data group D_1. Data coding unit 1030 further includes a flag setting part logic_5 and a data converter INV_5, and mode selector 1070 outputs five mode selecting signals MS_1, MS_2, MS_3, MS_4 and MS_5 to data coding unit 1030.

Figure 11:
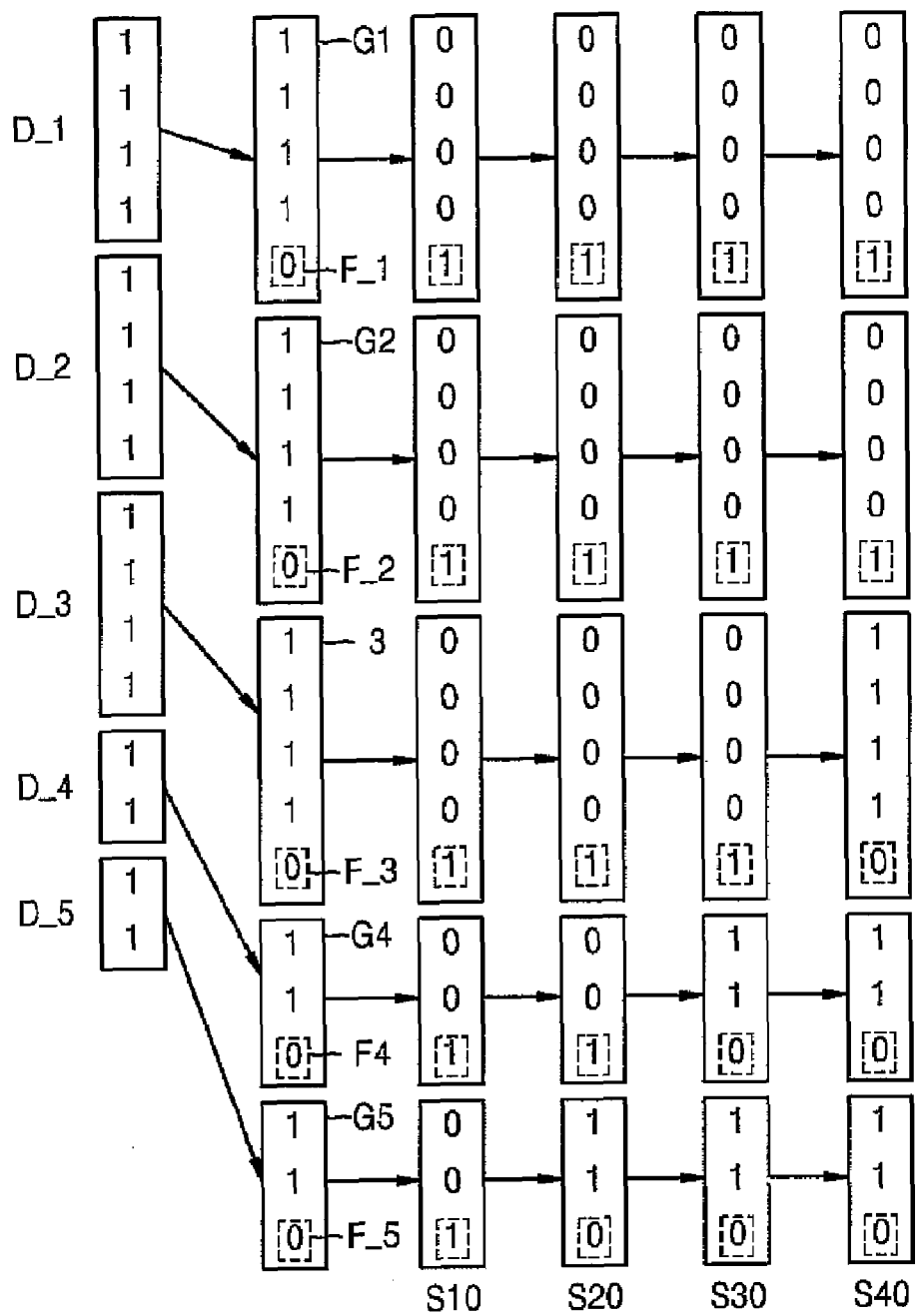
FIG. 11 illustrates a process of coding data in the transmission stage illustrated in FIG. 10.

FIG. 11 illustrates a process of coding data in transmission stage 910 shown in FIG. 10. The 16-bit data, grouped into first D_1 through fifth D5 data groups initially have the first logic state and the 16-bit data and 5-bit flag information F_1, F_2, F_3, F_4 and F_5 are grouped into first G1 through fifth G5 groups. In particular, first group G1 includes first data group D_1 and flag information F_1. Second group G2 includes second data group D_2 and flag information F_2. Third group G3 includes third data group D_3 and flag information F_3. Fourth group G4 includes fourth data group D_4 and flag information F_4. Fifth group G5 includes fifth data group D_5 and flag information F_5.

The second logic state of flag information F_1 through F_5 of the first G1 through fifth G5 groups is changed to the first logic state in order to minimize the number of data bits in the first logic state in each of the first G1 through fifth G5 groups in step S10. Consequently, the first G1 through fifth G5 groups include five bits in the first logic state and fifteen bits in the second logic state. The logic state of flag information F_5 of the fifth group G5 is changed to the second logic state in order to minimize the difference between the number of data bits and flag information data bit in the first logic state as compared to the number of data bits and flag information data bit in the second logic state in the first G1 through fifth G5 groups.

In particular, fifth group G5 is coded so that the difference between the number of data bits and flag information data bit in the first logic state and the number of data bits and flag information data bit in the second logic state in the first G1 through fifth groups G5 is minimized in step S20. In addition, each of the first G1, second G2, third G3 and fourth G4 groups are coded so that the number of data bits in the first logic state is minimized in step S20. Consequently, the first G1 through fifth G5 groups have six bits in the first logic state and fourteen bits in the second logic state. The first logic state of flag information F_4 of the fourth group G4 is changed to the second logic state in order to minimize the difference between the number of data bits and flag information data bit in the first logic state and the number of data bits and flag information data bit in the second logic state. Accordingly, each of the fourth G4 and fifth G5 groups are coded so that the difference between the number of data bits and flag information data bit in the first logic state and the number of data bits and flag information data bit in the second logic state in first G1 through fifth G5 groups is minimized and each of the first G1, second G2 and third G3 groups are coded so that the number of data bits in the first logic state is minimized in step S30. Consequently, the first G1 through fifth G5 groups have seven bits in the first logic state and thirteen bits in the second logic state.

The first logic state of flag information F_3 of the third group G3 is changed to the second logic state in order to minimize the difference between the number of data bits and flag information data bit in the first logic state and the number of data bits and flag information data bit in the second logic state. Each of the third G3, fourth G4 and fifth G5 groups are coded so that the difference between the number of data bits and flag information data bit in the first logic state and the number of data bits and flag information data bit in the second logic state in the first G1 through fifth G5 groups is minimized in step S40. Also in step S40, each of the first G1 and second G2 groups are coded so that the number of data bits in the first logic state is minimized. Consequently, the first through fifth groups G1 through G5 have ten bits in the first logic state and ten bits in the second logic state. The data coding operation is finished because the number of bits in the first logic state becomes equal to the number of bits in the second logic state.

Figure 12:
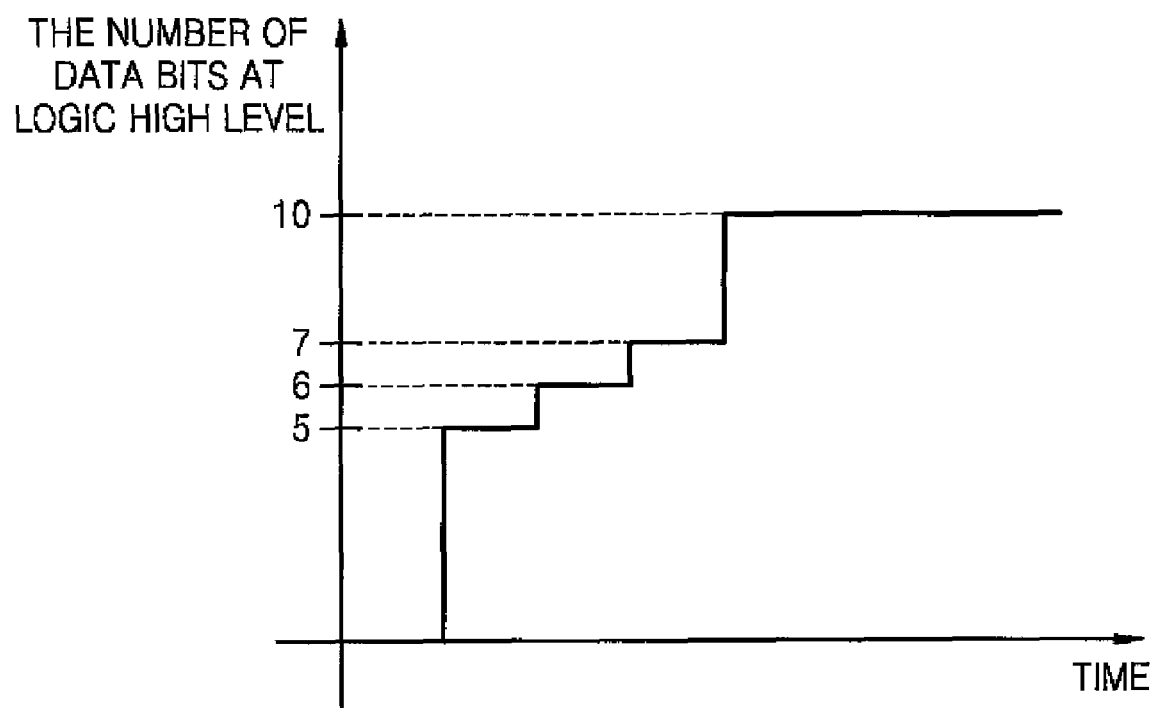
FIG. 12 is a graph illustrating an initial operation of the semiconductor memory device illustrated in FIG. 9 when the data coding process illustrated in FIG. 11 is performed.

FIG. 12 is a graph illustrating an initial operation of the semiconductor memory device 900 shown in FIG. 9 utilizing the data coding method illustrated in FIG. 11. Five bits in the first logic state are obtained when step S10 is executed, and these five bits are initially outputted through step S20. Seven bits in the first logic state are output via step S30, and then ten bits in the first logic state are outputted via step S40. In this manner, the number of bits in the first logic state is gradually increased. Again, this solves the aforementioned problem associated with a conventional semiconductor memory device where the initial logic state of data bits is changed due to a voltage drop in the initial operation.

A voltage drop caused by an inductor in the semiconductor memory device according to another embodiment of the present invention under the same condition as illustrated in FIG. 1 will now be explained with reference to FIGS. 1 and 8. When the inductance of the inductor connected between power supply voltage VDD and ground voltage VSS is 1 nH, the driving current of transmission stage TX outputting data is 20 mA, and the time taken to change the logic state of the output data bits to the first logic state is 0.5 ns, the voltage applied to the inductor is represented as:

$$V = n*L(di/dt) = 5*1 \text{ nH}*(20 \text{ mA}/0.5 \text{ ns}) = 0.2V \quad (3)$$

The voltage applied to the inductor is 0.2V in the initial operation of the semiconductor memory device because six data bits in the first logic state (n is the number of data bits in the first logic state) are outputted in the initial operation. Accordingly, the problem that the initial logic state of data bits is changed due to the voltage drop caused by the inductor in the initial operation of the conventional semiconductor memory device is solved.

As described above, the present invention can prevent the initial logic state of data bits from being changed due to a voltage drop in the initial operation of a semiconductor memory device. The number of data bits in the first logic state in the initial operation of the semiconductor memory device is gradually increased to stabilize the output of the initial data bits.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:
1. A semiconductor memory device comprising:
a plurality of counters configured to count the number of data bits and flag information data bits having a first logic state in a first data group including at least one data bit and second through nth data groups each including at least one data bit and a flag information data bit; and
a data coding unit communicating with said plurality of counters, said data coding unit selectively applying a first operation mode and a second operation mode to each of the first through nth data groups, said data coding unit coding data of each of the first through nth data groups wherein the first operation mode codes the data of each of the first through nth data groups to minimize the number of data bits in the first logic state in each of the first through nth data groups, and the second operation mode codes the data of each of the first through nth data groups to minimize the difference between the number of data bits and flag information data bits in the first logic stage and the number of data bits and flag information data bits in a second logic state associated with the first through nth data groups.

2. The semiconductor memory device of claim 1 wherein the data coding unit applies the first operation mode to each of the first through nth data groups and then applies the second operation mode to each of the first through nth data groups.

3. The semiconductor memory device of claim 1 wherein the number of data bits of the first group is smaller than the number of data bits associated with the data groups other than the first group.

4. The semiconductor memory device of claim 1 wherein the data coding unit further comprises:
   at least one flag setting portion configured to change the flag information of a corresponding group when the first mode is applied to the corresponding groups of the second through nth groups and when the number of data bits in the first logic state is greater than the number of data bits in the second logic state in the corresponding groups of the second through nth groups; and
   at least one data converter communicating with the at least one flag setting portion and inverting the data bits of the corresponding group including the changed flag information.

5. The semiconductor memory device of claim 4 wherein the flag setting portion changes the flag information initially set in the second logic state into the first logic state when the number of data bits in the first logic state is greater than the number of data bits in the second logic state, the flag setting portion further configured to maintain the initial logic state of the flag information when the number of data bits in the first logic state is smaller than the number of data bits in the second logic state.

6. The semiconductor memory device of claim 1 wherein the data coding unit further comprises:
   at least one flag setting portion configured to change flag information of a corresponding data group to minimize the difference between the number of data bits in the first logic state and the number of data bits in the second logic state in the first through nth data groups when the second operation mode is applied to the corresponding group of the second through nth data groups; and
   at least one data converter communicating with the at least one flag setting portion and inverting the data bits of the corresponding group including the changed flag information.

7. The semiconductor memory device of claim 1 further comprising a mode selector outputting mode selecting signals to the data coding unit in response to an enable signal such that the data coding unit applies one of the first and second operation modes.

8. The semiconductor memory device of claim 7 wherein the mode selector outputs the mode selecting signals to the data coding unit such that the second mode is sequentially applied to the second through nth data groups from the data group having the smallest number of data bits.

9. The semiconductor memory device of claim 7 wherein the mode selector outputs the mode selecting signals to the data coding unit such that the data coding unit applies the first operation mode to the second through nth data groups and then sequentially applies the second operation mode to the nth through second data groups.

10. The semiconductor memory device of claim 1 wherein the data coding unit applies the second operation mode to each of the first through nth data groups until the number of data bits and flag information data bits in the first logic state in the first through nth data groups becomes equal to the number of data bits and flag information data bits in the second logic state in the first through nth data groups.

11. The semiconductor memory device of claim 1 wherein the data coding unit applies the second operation mode to each of the first through nth data groups until the difference between the number of data bits and flag information data bits in the first logic state and the number of data bits and flag information data bits in the second logic state is not changed.

12. A data coding method in an initial operation of a semiconductor memory device, comprising:
    setting a first data group including at least one data bit and second through nth groups each of said groups including at least one data bit and a flag information data bit;
    coding the data bits of each of the first through nth groups such that the number of data bits and flag information data bits in a first logic state in each of the first through nth groups is minimized; and
    coding the data bits of each of the first through nth groups such that the difference between the number of data bits and flag information data bits in the first logic state and the number of data bits and flag information data bits in a second logic state in the first through nth groups is minimized.

13. The data coding method of claim 12, wherein the setting of the first through nth groups so that the number of data bits of the first group is smaller than the numbers of data bits of the other groups.

14. The data coding method of claim 12, wherein the coding of each of the data bits of the first through nth groups further comprising:
    changing the flag information of a corresponding group when the number of data bits in the first logic state is greater than the number of data bits in the second logic state in the corresponding group of the second through nth groups; and
    inverting the data bits of the corresponding group including the changed flag information.

15. The data coding method of claim 12, wherein the coding of the data bits of each of the first through nth groups further comprising:
    setting an initial logic state of the flag information of the second through nth groups to the second logic state;
    counting the number of data bits in the first logic state and the number of data bits in the second logic state in each of the second through nth groups;
    comparing the number of data bits in the first logic state with the number of data bits in the second logic state;
    changing the second logic state of the flag information to the first logic state when the number of data bits in the first logic state is greater than the number of data bits in the second logic state;
    maintaining the initial logic state of the flag information when the number of data bits in the first logic state is smaller than the number of data bits in the second logic state; and
    inverting the data bits of the groups including the flag information in the first logic state.

16. The data coding method of claim 12, wherein the coding of the data bits of each of the first through nth groups such that the difference between the number of data bits and flag information data bits in the first logic state and the number of data bits and flag information data bits is minimized further comprising:
    changing the flag information of a corresponding group such that the difference between the number of data bits and flag information data bits in the first logic state in the first through nth groups and the number of data bits and flag information data bits in the second logic state in the first through nth groups is minimized; and inverting the data bits of the corresponding group including the changed flag information.

17. The data coding method of claim 16, wherein the coding of the data bits of each of the first through nth groups such that the difference between the number of data bits and flag information data bits in the first logic state and the number of data bits and flag information data bits is minimized further comprising:

counting the number of data bits and flag information data bits in the first logic state and the number of data bits and flag information data bits in the second logic state; and comparing the number of data bits and flag information data bits in the first logic state to the number of data bits and flag information data bits in the second logic state.

18. The data coding method of claim 12, wherein the coding of the data bits of each of the first through nth groups such that the difference between the number of data bits and flag information data bits in the first logic state and the number of data bits and flag information data bits is minimized further comprising sequentially changing the flag information of the second through nth groups from the group having the smallest number of data bits.

19. The data coding method of claim 12, wherein the coding of the data bits of each of the first through nth groups such that the difference between the number of data bits and flag information data bits in the first logic state and the number of data bits and flag information data bits is minimized further comprising sequentially maintaining the flag information of the second through nth groups from the group having the smallest number of data bits.

20. The data coding method of claim 12, wherein the coding of the data bits of each of the first through nth groups such that the difference between the number of data bits and flag information data bits in the first logic state and the number of data bits and flag information data bits is minimized further comprising sequentially changing the flag information of the nth through second groups.

21. The data coding method of claim 12, wherein the coding of the data bits of each of the first through nth groups such that the difference between the number of data bits and flag information data bits in the first logic state and the number of data bits and flag information data bits is minimized further comprising sequentially maintaining the flag information of the nth through second groups.

22. The data coding method of claim 12, wherein the coding of the data bits of each of the first through nth groups such that the difference between the number of data bits and flag information data bits in the first logic state and the number of data bits and flag information data bits in the second logic state is minimized further comprising coding the data bits of each of the first through nth groups until the number of data bits and flag information data bits in the first logic state becomes equal to the number of data bits and flag information data bits in the second logic state.

23. The data coding method of claim 12, wherein the coding of the data bits of each of the first through nth groups such that the difference between the number of data bits and flag information data bits in the first logic state and the number of data bits and flag information data bits in the second logic state is minimized further comprising coding the data bits of each of the first through nth groups until the difference between the number of data bits and flag information data bits in the first logic state and the number of data bits and flag information data bits in the second logic state is not changed.

24. A semiconductor memory device comprising:

a plurality of counters counting the number of data bits and flag information data bits in a first logic state in each of first through nth groups each including at least one data bit and flag information data bit; and a data coding unit communicating with said plurality of counters, said data coding unit selectively applying a first operation mode and a second operation mode to each of the first through nth groups and coding data of each of the first through nth groups, wherein the first operation mode coding the data of each of the first through nth groups such that the counted number of data bits in the first logic state in each of the first through nth groups is minimized, and the second operation mode coding the data of each of the first through nth groups such that the difference between the number of data bits and flag information data bits in the first logic stage and the number of data bits and flag information data bits in a second logic state in the first through nth groups is minimized.

25. The semiconductor memory device of claim 24, wherein the data coding unit applies the first operation mode to each of the first through nth groups and then applies the second operation mode to each of the first through nth groups.

26. The semiconductor memory device of claim 24, wherein the data coding unit comprises:

at least one flag setting portion changing the flag information of a corresponding group when the number of data bits in the first logic state is greater than the number of data bits in the second logic state in the corresponding group of the first through nth groups when the first mode is applied to the corresponding group of the first through nth groups; and at least one data converter inverting the data bits of the corresponding group including the changed flag information.

27. The semiconductor memory device of claim 24, wherein the data coding unit comprises:

at least one flag setting portion changing the flag information of a corresponding group to minimize the difference between the number of data bits in the first logic state and the number of data bits in the second logic state in the first through nth groups when the second mode is applied to the corresponding group of the first through nth groups; and at least one data converter inverting the data bits of the corresponding group including the changed flag information.

28. The semiconductor memory device of claim 24, further comprising a mode selector outputting mode selecting signals to the data coding unit in response to an enable signal such that the data coding unit applies one of the first and second modes.

29. A data coding method in an initial operation of a semiconductor memory device, comprising:

setting first through nth groups each including at least one data bit and flag information data bit;

coding the data bits of each of the first through nth groups such that the number of data bits and flag information data bits in a first logic state in each of the first through nth groups is minimized; and coding the data bits of each of the first through nth groups such that the difference between the number of data bits and flag information data bits in the first logic state and the number of data bits and flag information data bits in a second logic state in the first through nth groups is minimized.

30. The data coding method of claim 29, wherein the coding of the data bits of each of the first through nth groups such that the number of data bits in the first logic state is minimized further comprising:

changing the flag information of a corresponding group when the number of data bits in the first logic state is greater than the number of data bits in the second logic state in the corresponding group of the first through nth groups; and inverting the data bits of the corresponding group including the changed flag information.

31. The data coding method of claim 29, wherein the coding of the data bits of each of the first through nth groups such that the difference between the number of data bits and flag information data bits in the first logic state and the number of data bits and flag information data bits is minimized further comprising:

changing the flag information of a corresponding group such that the difference between the number of data bits and flag information data bits in the first logic state in the first through nth groups and the number of data bits and flag information data bits in the second logic state in the first through nth groups is minimized; and inverting the data bits of the corresponding group including the changed flag information.

* * * * *